Jan. 16, 1968 D. C. BRODERICK 3,364,445

GASEOUS-SOLID STATE POWER LIMITER HAVING A SELF-BIASING CIRCUIT FOR THE SOLID STATE DEVICE

Filed Feb. 4, 1966 4 Sheets-Sheet 1

Inventor:
David C. Broderick
By: Robert L. Slater, Jr
Atty.

Inventor:
David C. Broderick
By: Robert L. Slater, Jr.
Atty.

Inventor:
David C. Broderick
By: Robert L. Slater, Jr.
Atty.

Inventor:
David C. Broderick
By: Robert L. Slater, Jr.
Att'y.

3,364,445

GASEOUS-SOLID STATE POWER LIMITER HAVING A SELF-BIASING CIRCUIT FOR THE SOLID STATE DEVICE

David C. Broderick, Beverly, Mass., assignor to Metcom, Inc., Salem, Mass., a corporation of Delaware Continuation-in-part of application Ser. No. 214,546, Aug. 3, 1962, now Patent No. 3,249,899. This application Feb. 4, 1966, Ser. No. 527,396
6 Claims. (Cl. 333—13)

The present invention relates to devices for limiting passage of peak loads to electromagnetic energy into sensitive radio receiver equipment; more particularly, it relates to power limiters having solid state components wherein incident radiation power is utilized to bias the solid state components.

This application is a continuation-in-part of a copending application filed Aug. 3, 1962, titled, "Gaseous-Solid State Power Limiter," David C. Broderick, inventor, Ser. No. 214,546 and which matured into Patent No. 3,249,899.

Radar, microwave systems and other higher frequency systems require that sensitive system components, receivers, and crystal detectors be protected from direct incidence of high powered radio frequency energy pulses. For instance, in radar equipment exposure of sensitive parts of the system to destructively high powered microwave pulse signals arises when the high powered pulse generator, most frequently a magnetron, fires, or when directly beamed signals from a second microwave system fall on the antenna and are transmitted back to the receiver or other sensitive elements of the system. When protection from excessively high power pulse signals is being designed, for example for use in a radar system, it is known what frequency signals will be emitted by the magnetron or signal generator incorporated within the system. However, it is not predictable what frequency range of signals arising from other radar sets may be beamed directly onto the antenna of the system. It is, therefore, important that the sensitive elements of a radar system be protected against stray high powered radiation throughout a wide range of frequency bands.

Gaseous electron discharge tubes which have a resonant discharge gap mounted within a cavity have long been utilized as TR or transmit-receive tubes and ATR or anti-transmit-receive tubes in radar systems. In typical installations, the TR tube is mounted so that upon incidence of a high power pulse signal, the tube fires; that is, the gas within the tube cavity ionizes and electrons are discharged. As a result of the electron discharge a highly conductive electron stream or arc shorts the wave guide, which in the conventional installation designs isolates the receiver from the incident high powered signal.

One disadvantage of the conventional TR tube mounted within a wave guide is the restricted frequency range of signals which will dependably fire the tube. RF signals of sufficient power to damage the sensitive receiver components will often be passed by the conventional gaseous electron discharge tube when those signals have shorter wave lengths than the pass band wave length of the gap within the tube cavity.

Another disadvantage of the conventional gaseous TR tube is the fact that in the brief interval of time between the incidence of the signal and the actual shorting of the TR tube by the electron discharge, a substantial power "spike" passes the tube and travels into the receiver. This initial power spike passes the gap even though a powered "keep alive" electrode is mounted in the resonant gap of the electron discharge tube.

A continuing trend of utilizing more powerful signal generators and even more sensitive receivers has heightened the need for improved, more reliable, broader frequency band protection of receivers and particularly receiver crystals in radar systems.

The ideal microwave receiver protective device affords substantial attenuation of high powered signals throughout a wide range of frequencies, a low insertion loss for low powered signals, rapid recovery time to accommodate high pulse repetition rate, and dependable long life operation. Some solid state semiconductor devices exhibit in a general way the highly nonlinear power attenuation characteristics that are required to pass low power signals with minimal insertion loss and attenuate high power signals with high efficiency. However, none of the existent solid state components are suitable for direct substitution for the gaseous electron discharge tube. The reason for this unsuitability in existing solid state devices for direct substitution for gaseous electron discharge tubes arises from the fact that these semiconductor devices are limited by their maximum power density; that is, most solid state or semiconductor devices are extremely small and dissipate only a limited amount of energy by radiation or convective cooling. Another limitation of existing semiconductor devices which renders them unsuitable for direct substitution for gaseous electron discharge TR tubes is that they exhibit relatively large reactances which cause reflection of incident power. High frequency performance in solid state devices, that is, in the megacycle and kilomegacycle region, requires that the distances between the electrodes and boundaries of the component parts of the device be sufficiently short so that junction reactance, spreading resistance and transit times of electrons or holes through the semiconductor will be consistent with high frequency requirements of the device. In general, then, the smaller the solid state or semiconductor structures, the higher the frequency response before cut-off exhibited by the device but the less capacity in general the semiconductor device will exhibit to dissipate heat in higher power applications and, in a general sense, the less easily will the device be matched in impedance to the input and output structures with which it is mounted in a given system.

There exists, then, need for improved power limiting devices which effectively function across a wide frequency range and afford low insertion loss for low power signals and high attenuation for high power signals. Presently used gaseous electron discharge tubes have typical insertion losses of 0.5 db of low power signals, that is, signal strengths of 1–2 watts peak power, and 10 db attenuation of high power signals, that is, signal strengths above 10 watts peak power, through a frequency pass band range of ten percent.

One object of my invention is to provide a novel power limiter for radio frequency signals ranging from UHF frequencies upward.

Another object of my invention is to provide a radio frequency band power limiter with an improved broadened frequency band response.

Another object of my invention is to provide a highly efficient radio frequency power limiter which reduces and substantially eliminates the initial power "spike" which passes conventional gaseous electron discharge tubes.

Another object of my invention is to provide a broad radio frequency band power limiter utilizing lightweight, compact, solid state semiconductor structures.

Another object of my invention is to provide a novel, compact, rugged, general purpose radio frequency power limiter.

Still another object of my invention is to constructively utilize the incident RF power to bias components of my power limiter.

These and other objects and advantages of my invention will be apparent from the following drawings, specification and claims.

Figure 1:
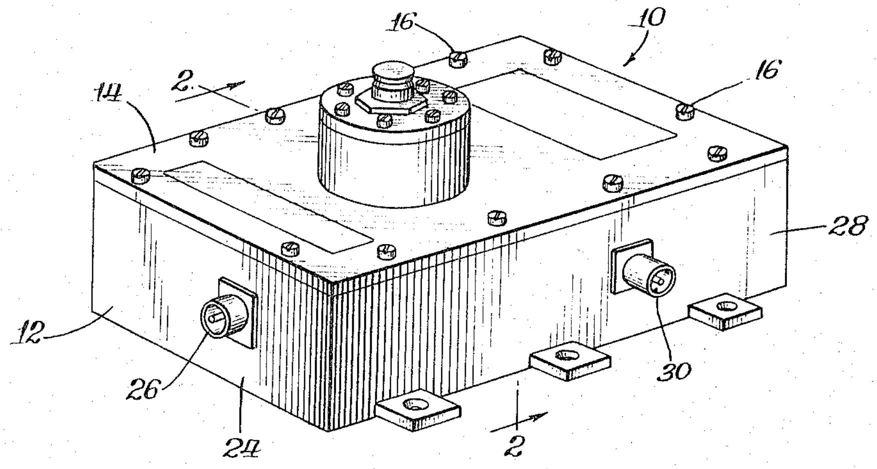
FIGURE 1 is a perspective view of the external features of a preferred embodiment of my invention.
Figure 2:
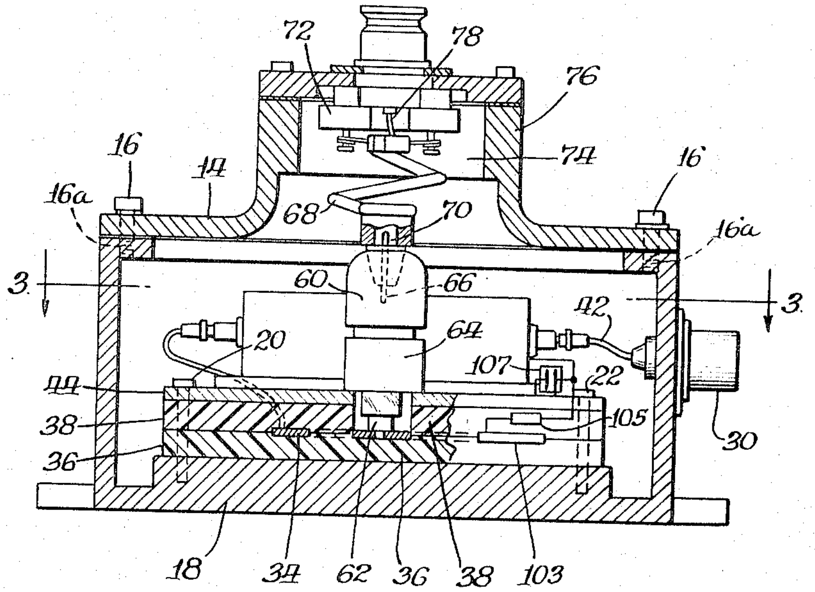
FIGURE 2 is a cross-section view taken on plane 2—2 of the embodiment of my invention shown in FIGURE 1.

Referring now to the drawings, FIGURE 1 illustrates the external features of a preferred embodiment of my invention wherein a conductive metal case 10 comprised of an elongated four-sided housing 12 is made RF radiation tight by a bolted conductive metal top 14. The top 14 is held securely in place on the case 10 by means of a plurality of threaded bolts 16. In the particular embodiment shown in FIGURES 1 through 4, threaded holes **16*a* are provided in the side walls of the housing 12 to receive the bolts 16. The interior of the metal housing 12 is provided with a conductive metal bottom plate 18, which is sufficiently thick to accommodate threaded fasteners or screws 20 and 22. A first end or side 24 of the metal case is provided with an input coaxial connector 26; a second end, or as shown in the particular embodiment, a side 28 of the metal case 10 is provided with an output coaxial connector 30**.

Within the case 10, and mounted upon the bottom plate 18, is an elongated electrical conductor 34, positioned between layers of dielectric material 36 and 38. The elongated conductor 34 is electrically isolated from the conducting case 10 but connected electrically to the input coaxial connector 26 at a first end and, through electronic component means which are described below, connected to the output coaxial connection 30 by short shielded lead 42 at its second end. A conducting metal plate 44 is positioned above the uppermost dielectric layer 38 and is held in place and in turn holds the elongated conductor 34 and the dielectric layers in place by means of the threaded fasteners 20 and 22. The electrical conductor 34 is divided into two sections, the first high impedance section 40 and a following low impedance section 46; the two sections are joined at junction 48. The line section 40 is an ohmic resistance high impedance conductor; the impedance of the conductor may be readily varied in different embodiments of my invention by varying the width and thickness of the conductor which is conveniently made of high conductivity copper. The high impedance section 40 of the conductor 34 must be at least a compensated one-half wave length long section at the center frequency of the transmission band. The section 40 of the conductor may be bent into a series of open loops to save space; such a space saving configuration is readily seen by reference to FIGURE 3. The whole arrangement of the high impedance section 40 of the conductor 34, dielectric layers 36 and 38, and plates 18 and 44 comprises a stripline cavity.

The conductor section 46 terminates at its second or output end 50, at which point a short shielded lead 52 connects it to an electrical filter assembly generally indicated at 56. The electrical wave filter 56, described elsewhere in more detail, is the electrical component means referred to above through which the conductor 34 is connected to the output coaxial connector 30.

A gaseous electron discharge tube 60 consisting essentially of two electrodes positioned to form a resonant gap within an envelope containing a gas such as $N_2$ at a low pressure of between 0.5 and 40 mm. of Hg is mounted within the case 10, so that one electrode 62 of the tube is in electrical contact with the high impedance section 40 of the conductor 34 at a point on the conductor a spaced distance from the junction 48 between the high impedance and low impedance sections of the conductor. The point of contact between the electrode 62 and the conductor section 40 is carefully selected to be a one-quarter compensated electrical wave length from the junction 48 on the conductor 34. Stated differently, the point of contact between the electrode 62 and the conductor 34 is at a voltage maximum of a standing wave on the conductor. The standing wave pattern is a result of wave reflections from variation in impedance in the line, such as occurs at the junction 48 in the stripline. The second electron discharge tube electrode 64 is connected to electrical ground through the plate 44. A coaxial "keep alive" electrode 66 included in the electron discharge tube 60 is powered through an insulated lead 68 which makes contact with the "keep alive" electrode through terminal 70. The case top 14 is provided with an insulated bracket 72 which provides a mounting for a conductor 78 through which power may be supplied to the "keep alive" electrode 66 without contact to the housing and top 14 which are at electrical ground potential. To accommodate the gaseous electron discharge tube 60 and the insulated bracket 72, a concave recess 74 is formed in the top cover 14 which is contained within a cylindrical boss 76 that projects above the top cover.

The filter 56 is a modified Pi L C circuit which may in addition to the passive elements include any of several nonlinear solid state semiconductor devices. Various arrangements of passive capacitive and inductive components will serve the purpose of the filter 56 in my invention. A preferred circuit arrangement and the one illustrated in the embodiment shown in FIGURES 1 through 4 comprises inductances 82, 84, 86 and 88 in series; two circuits 90 and 92 which branch at the terminals of inductances 82 and 84 and are connected to ground through capacitors 94 and 96; and a third circuit 100 which branches from between two trimmer capacitors 104 and 106 connected in series between inductances 86 and 88. Circuit 100 connects the forward path within the filter 56 to ground through a semiconductor device 102.

The filter 56 components are mounted or bracketed within an RF radiation tight container 98 which in turn may be conveniently secured to the plate 44 for mounting and ground connection.

The semiconductor device 102 may be any of a variety of diodes which are nonlinear with respect to voltage; that is, the resistance in the forward path decreases rapidly with application of increasing voltage, making the device highly conductive at high voltage and capacitive at low voltage. Silicon diffused junction diodes of the mesa design, commonly called varactors, have operated satisfactorily in specific embodiments of my invention. A typical silicon diode which I have utilized in these models is conductive in the forward path at 0.6 volt, has cutoff frequency above 100 kmc., and dissipates up to 300 milliwatts of power.

When an RF signal having a wave length in the pass band of the cavity is fed through the input connector 26, the signal is propagated by low loss normal transmission means along the high impedance section 40 of the conductor 34. A standing wave is formed as a reflection of energy waves from any impedance mismatch along the conductor 34; the first reflective impedance mismatch occurs at junction 48 where the high impedance section 40 and the low impedance section 46 of the conductor 34 join. A standing wave pattern is formed by the reflected waves and a point of maximum voltage difference between the conductor and the ground potential occurs at the crest of the standing voltage wave. The gaseous electron discharge tube 60 is mounted so that the electrode terminal 62 makes contact with the conductor section 40 at a point of high impedance on the conductor which is a maximum voltage point resulting from the standing wave pattern. In the embodiment of my invention illustrated in FIGURE 1, a voltage maximum occurs at one-quarter electrical wave length measured along the conductor section 40 back from the junction point 48.

Another source of reflected waves which results in a standing wave pattern on the conductor occurs in the filter assembly 56. The filter assembly 56 is comprised of two components, a low pass filter formed by the capacitors 90 and 92 and inductances 82, 84 and 86 and a band pass filter which includes the varactor 102, the capacitors 104 and 106, and the inductances 86 and 88. The low pass filter rejects signals having wave lengths shorter than that of the band pass frequencies which dependably will fire the electron tube 60. The band pass filter, within the limitations of the sharpness or "Q" of that filter, provides protection against passage of high powered pulses of energy in the frequencies both above and below the band pass frequency of the filter assembly 56. However, in order that there be sufficiently low attenuation of low power signals, the "Q" of the filter 56 must be small enough to permit propagation of signals throughout a considerable frequency band. The destructively high powered signals of shorter wave length within the band pass frequency range will propagate through the filter into the sensitive receiver components but will not dependably fire the electron discharge tube 60.

The function of the semiconductor device 102 in the band pass filter is twofold. The semiconductor 102 at low power levels is nonconductive and highly capacitive. When the semiconductor device is in a capacitive, nonconductive condition, the frequency pass band of the filter is broad; attenuation of low power signals in the pass band frequencies is minimized. When the power level of the incident signals exceeds one milliwatt, which corresponds to 0.7 volt peak power in the embodiment of my invention described herein, the semiconductor device begins to conduct and detunes the band pass filter. Greater rejection of the short wave length, high powered signals is thus obtained by the detuned filter. Thus the semiconductor device at low incident signal power serves to increase capacitance of the filter and decrease attenuation; and at high incident signal power the varactor becomes conducting, exhibits less capacitance, and detunes the filter, resulting in rejection of the signals at the shorter wave length region of the passed frequency band that are less likely to fire the gaseous electron discharge tube.

In order to heighten the sensitivity of the semiconductor 102, a forward bias voltage may be applied to the nongrounded terminal. When properly biased the semiconductor 102 will begin conducting at less than the aforesaid 0.7 volt peak power. It is desirable that the bias be applied only when high powered destructive RF waves are present and detuning of the filter 56 is required. If the semiconductor device 102 is biased with a constant DC bias, some loss of moderate power signal waves will be occasioned by the easy detuning of the filter 56.

Figures 3, 4:
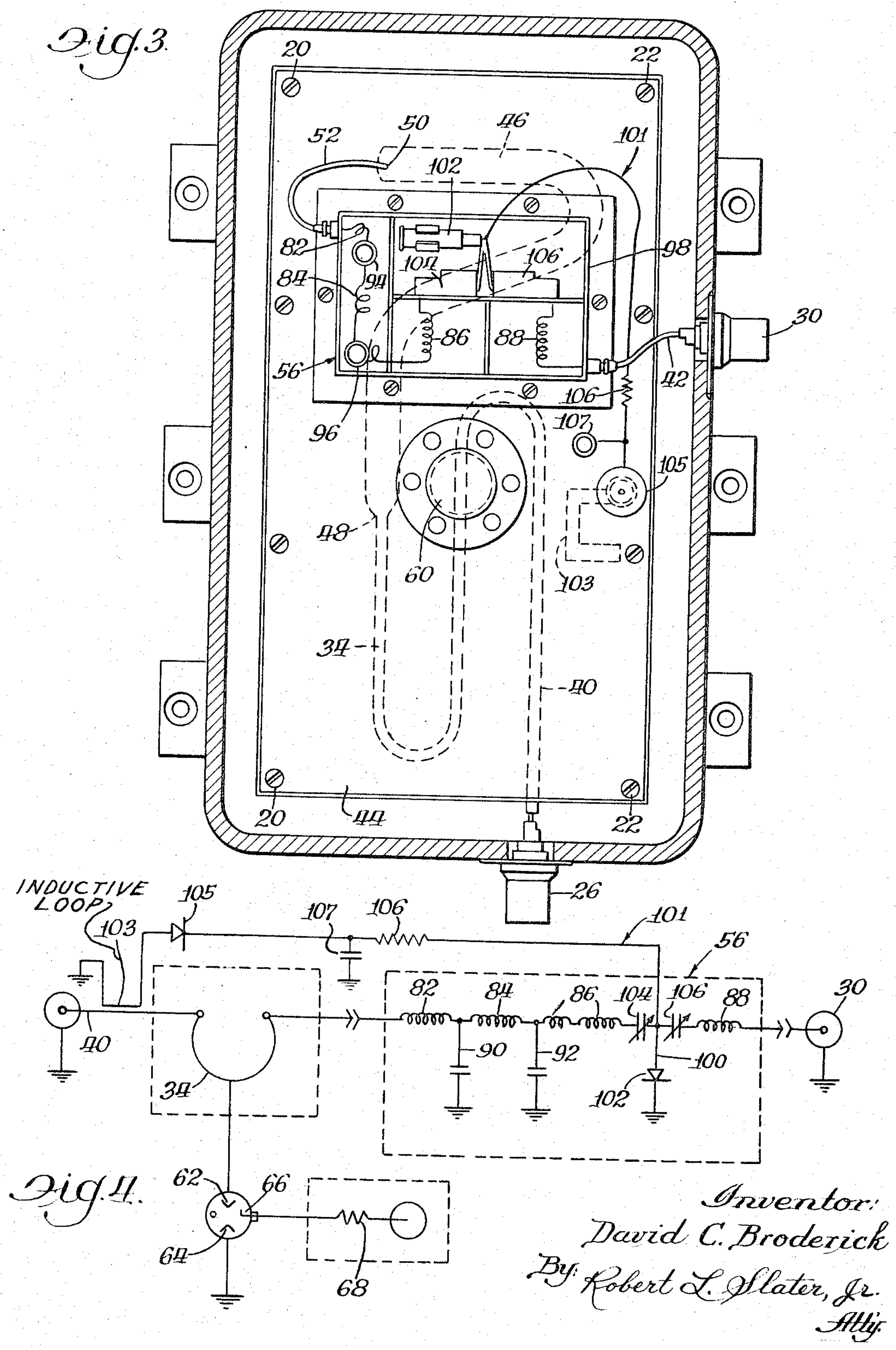
FIGURE 3 is a second cross-sectional view taken on plane 3—3 of the embodiment of my invention shown in FIGURE 1.
FIGURE 4 is a schematic circuit diagram of the electrical circuit of the embodiment of my invention shown in FIGURE 1.
Figure 5:
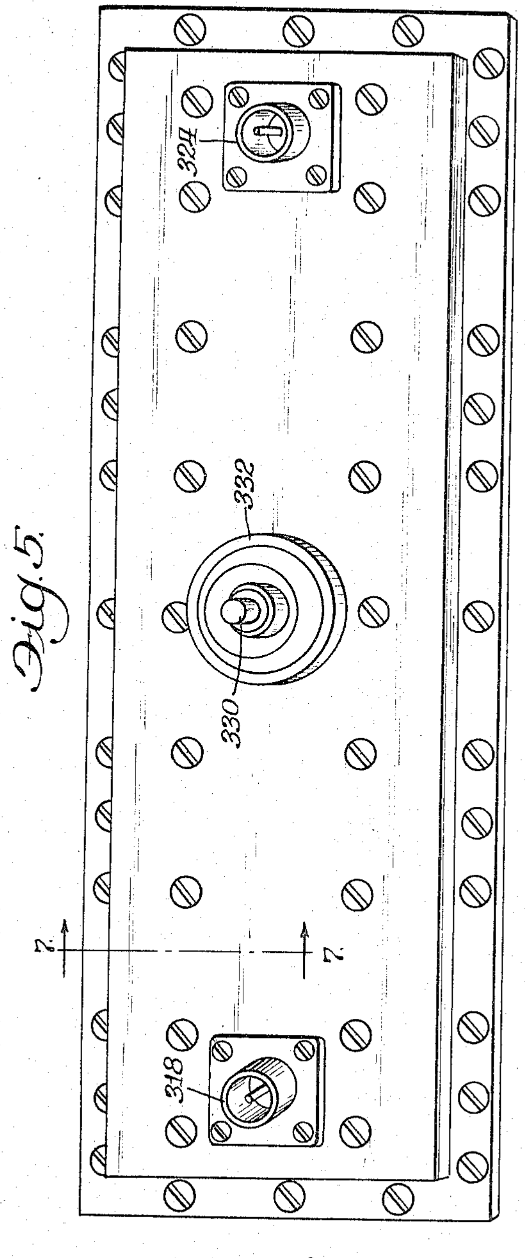
FIGURE 5 is a top plan view of a second preferred embodiment of my invention.

A separate circuit 101 is energized through a coupling loop 103, coupling the circuit to the elongated conductor 40 near the input of the device. Forward conducting diode 105, which may be of the semiconductor variety, is inserted in circuit 101 ahead of coupling 103 and in series with appropriate resistance 106. Resistance 106 is connected to the nongrounded side of semiconductor device 102, and a small capacitor 107 is inserted between this connection and electrical ground to improve the balance of the bias energy applied to semiconductor 102. Circuit 101 is grounded at the extreme end adjacent the loop 103 as shown in FIGURE 4.

Presence of weak incident RF waves in conductor 40 will only weakly couple energy into the inductive loop 103. However, the presence of high energy RF waves on the conductor 40 will strongly couple energy into circuit 101 and switch the semiconductor 102 into a condition of conductance or near conductance, thereby effectively detuning the filter 56.

The voltage peaks in the standing waves on the conductor 34 are proportional to the power of the incident signal; hence, the tube 60 will fire and short to ground the elongated conductor 34 when the peak voltage in the standing wave exceeds the critical ionization voltage of the electron discharge tube. Typical voltages, for example, for firing gaseous electron discharge tubes are 10–20 volts in the UHV band.

The filter assembly 56 passive component L and C values are selected in accordance with well known engineering principles. The filter is designed to pass signals in a frequency band that includes the longer transmission wave lengths of the stripline, filter and connector assembly, and to minimize insertion losses for low power signals. The passive filter components reject the shorter wave length signals in those frequency bands above the transmission band frequencies efficiently, but cannot without increasing the insertion loss to intolerable values reduce the initial power "spike" signal in the transmission band which passes the gas tube prior to the tube firing. Similarly, the passive filter cannot attenuate the strong signals in the transmission frequency band which pass through the stripline when for some reason the gas tube fails to fire. In these latter two circumstances the semiconductor device 102, biased into conduction or near conduction by the action of circuit 101, shunts the high power signals to ground.

Hence, with the combination of the gaseous electron discharge tube, the passive filter and the intermittently self-biasing semiconductor, all mounted in spaced relationships with respect to the electrical distances along a common conductor, a very reliable low power signal, low insertion loss and high power signal, high attenuation system is provided.

A second preferred embodiment of my invention is illustrated in FIGURES 5, 6, 7 and 8. An elongated conductor 310 is mounted in electrical isolation from, but within, an RF tight case 312 between two layers of high dielectric material 314 and 316. An output coaxial connector 318 mounted externally of the case connects to an output point 320 a spaced distance from the output end 322 of the elongated conductor 310. An input coaxial connector 324, mounted externally of the case 312, connects through electronically component means 336, described below, to the input end 328 of the elongated conductor 310.

A gaseous electron discharge tube 330 having two electrodes is mounted within the case 312 and connects to a point at a spaced distance from the input end 328 of the elongated conductor with a first electrode and connects to ground potential with the second electrode. The tube 330 is encased within a hollow cylindrical boss 332 mounted integral with the case 312. The electrodes of the gaseous electron discharge tube 330 are not shown in FIGURE 6; however, the tube 60 shown in the embodiment of FIGURES 1–4 may be directly substituted for the tube 330. The point 334 on the elongated conductor 310, where contact with the first electrode of the tube 330 is made, is in the vicinity of a voltage peak of a standing wave on the elongated conductor 310. Normally, a standing wave voltage maximum occurs one-quarter electrical wave length on the conductor measured back from the input end 328 thereof. The standing wave pattern is the result of reflection of waves from an impedance mismatch at the junction of the elongated conductor 310 and the electronic means 336.

Figure 6:
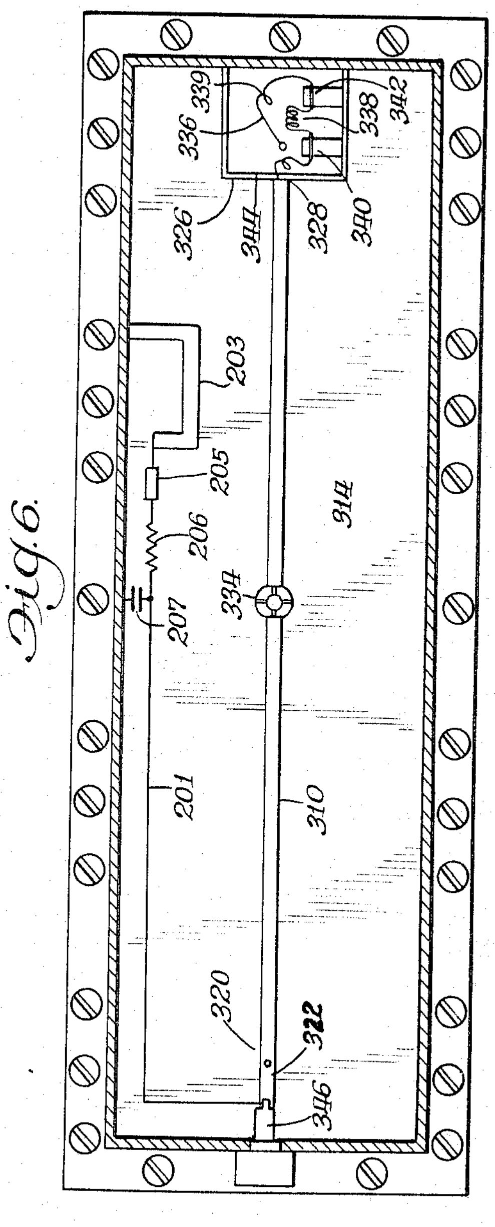
FIGURE 6 is a cross-sectional view taken on a horizontal plane of the embodiment of my invention shown in FIGURE 5.
Figure 7:
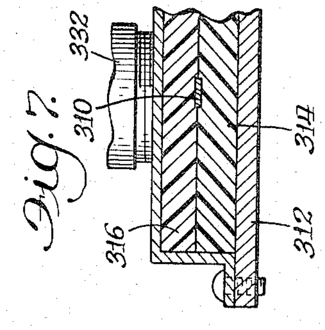
FIGURE 7 is a transverse cross-sectional view taken on plane 7—7 of the embodiment of my invention shown in FIGURE 5.
Figure 8:
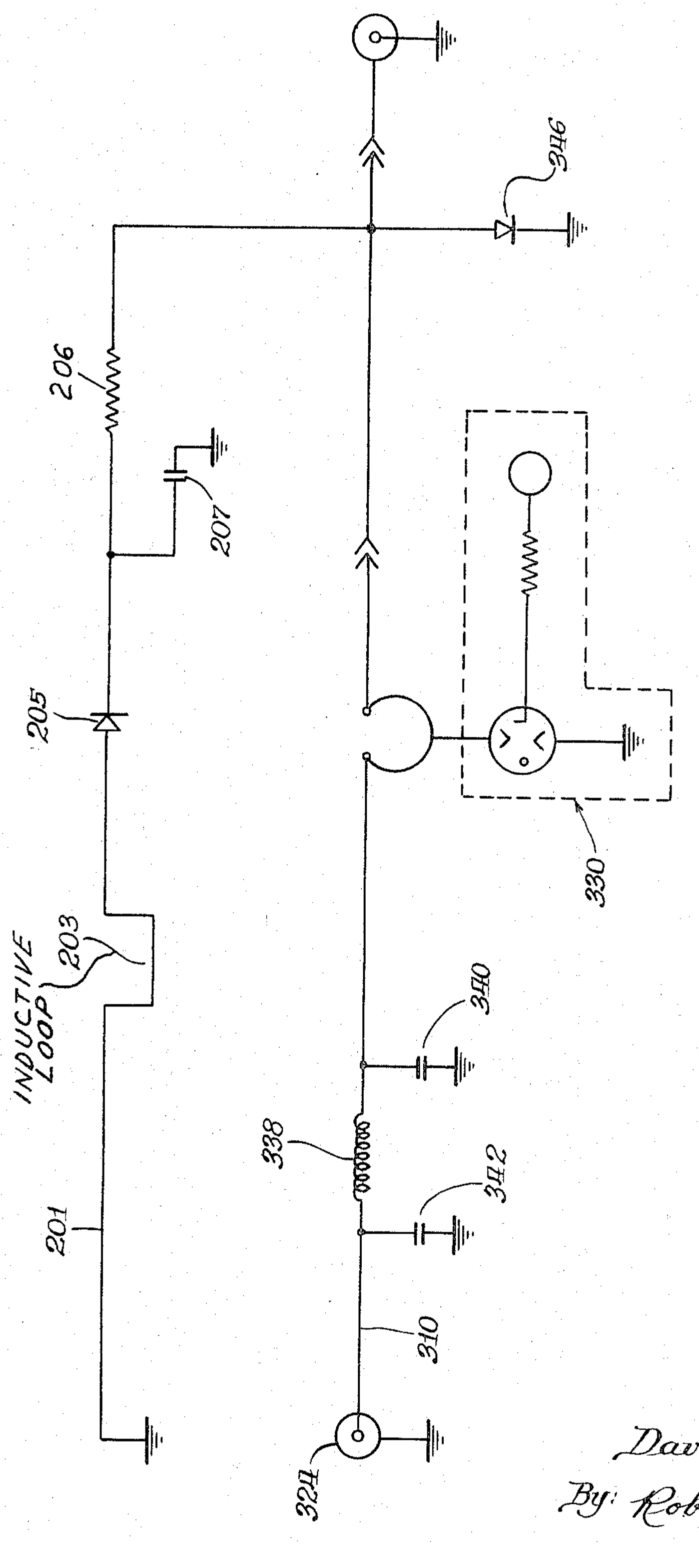
FIGURE 8 is a schematic circuit diagram of the electrical circuit of the embodiment of my invention shown in FIGURES 5, 6 and 7.

The electronic means 336 is comprised of a pass band filter which may be any of a variety of configurations of passive inductive and capacitive elements. Passive filters may be designed in accordance with well known engineering principles. The pass band filter 336 shown in FIGURE 6 is comprised of the combination of inductances 338 and 339 and capacitors 340 and 342 mounted within an RF tight container 344 along with a solid state semiconductor device 346 mounted within the case 312 and positioned between the output end 322 of the conductor 310 and electrical ground. The above described circuit arrangement is most readily seen by reference to FIGURE 8. The semiconductor device 346 may be selected from any of a variety of solid state diodes; the embodiment illustrated utilized a diffused junction diode with mesa design, also referred to as a varactor.

At low incident power the semiconductor diode 346 is capacitive and tends to broaden the transmission characteristics of the pass band filter. This action assures minimum insertion loss at low incident power. At high incident power, that is, signals having one milliwatt power and above (UHF frequency range), the semiconductor device 346 is conductive. In the conductive condition the diode detunes the pass band filter which then rejects shorter wave length signals and also shunts power from the high power signals directly to ground. The positioning of the semiconductor diode 346 at the output end 322 of the elongated conductor and passive filter components at the input end of the conductor 310, provided all the components—stripline conductor 310, diode 346, and passive filter components—are carefully selected and mounted to comprise a tuned pass band filter, introduces no change in the operating charcteristics different from that of the embodiment of my invention illustrated in FIGURE 1–4 and described above.

The semiconductor diode 346 is forward biased by the action of a separate circuit shown at 201. The bias circuit 201 is comprised of a coupling loop 203 mounted in close adjacent relationship to the stripline conductor 310, a diode 205 in series with the loop 203 for rectification of signals, a resistance 206, and a capacitance 207. The circuit 201 is grounded at a first end and terminates at the input of the diode 346. Resistance 206 is connected in series to the semiconductor 346; the small capacitor 207 is shunted to ground. The resistance and capacitance are optional components in circuit 201, inserted to improve the balance of the bias signal applied to the diode 346.

In the event a high power incident radiation signal passes through the stripline conductor 310, it is coupled through the coupling loop 203, whereupon the bias signal is rectified by the diode 205 and is applied at the input of the diode 346. The forward biased diode 346 then detunes the pass band filter 326 and shunts the main incident radiation power pulse propagated along conductor 310 to ground. The improved device described above and illustrated in FIGURES 6 and 8 comprises a self-biased diode circuit which greatly reduces risk of a high energy spike passing through the pass band filter before the gaseous electron discharge tube fires or before the diode 346 is sufficiently biased by the action of the incident radiation waves impinging on the diode 346 to drive it into conduction and shunt the damaging power pulse to ground. On the other hand, a constant forward bias voltage applied to the diode 346 would detune the filter circuit 326 and diminish passage of the desired weak signals within the filter pass band.

The above illustrations and specification of two specific embodiments of my invention are merely illustrative of the principles of my invention and are intended in no way to limit the scope of my invention, for which I claim:

1. In combination with a device for limiting the power of high frequency radio frequency signals, such device being of the type comprising a cavity; an elongated conductor mounted within the cavity and electrically insulated therefrom, the conductor having a first end and at a spaced electrical distance a second end, the conductor being mounted within the cavity such that radio frequency signals of only limited transmission band frequency are propagated along the conductor; a gaseous electron discharge tube having a first terminal connected to the conductor at a spaced electrical distance from the second end thereof, a second terminal of said tube being connected to electrical ground; and a passive electrical filter means connected to the second end of the conductor, the filter means having a transmission pass band at the higher frequencies of the transmission band of said elongated conductor; the improvement which comprises: a bias circuit, including a coupling loop mounted within the cavity adjacent to the elongated conductor to couple radio frequency energy into said bias circuit and a rectifying means associated with the coupling loop to rectify said radio frequency energy; and a variable reactance semiconductor device having a first terminal connected to the passive electrical filter means and to the bias circuit and a second terminal connected to electrical ground, whereby high powered electrical signals propagating along the conductor are coupled to the bias circuit, and therein rectified and utilized to forward bias the semiconductor device causing detuning of the electrical filter means and thereby blocking passage of said high powered electrical signals.

2. In combination with a device for limiting the power of high frequency electrical signal pulses, such device being of the type comprising a resonant cavity; a conductor mounted within the resonant cavity, the conductor having a first end and at a spaced electrical distance from a second end, the conductor being mounted within the cavity such that electrical signals of only a limited transmission band frequency are propagated along the conductor; a passive filter circuit electrically connected to the second end of the conductor; a gaseous electron discharge tube having a first terminal connected to the conductor at a quarter wave length spaced electrical distance from the second end of the conductor, wherein the first terminal contacts the conductor at a point of maximum standing wave voltage, a second tube terminal being connected to electrical ground; the improvement which comprises a two-terminal semiconductor device connected between the passive filter circuit and electrical ground, and bias circuit means connected to the semiconductor device for forward biasing the semiconductor device with a signal pulse derived from electrical signal pulses propagating along the conductor and to detune the electrical filter means and thereby block passage of the high powered electrical signals.

3. In combination with a device for limiting the power of high frequency electrical signals, such device being of the type comprising: a resonant cavity; a conductor having electrical impedance mounted within the cavity, the conductor having a first end and at fixed electrical wave length distance a second end; electrical filter means having electrical impedance different from the electrical impedance of the conductor, the filter means being connected to the second end of the conductor to pass a predetermined bandwidth of said high frequency signals along the conductor; and a gaseous electron discharge tube mounted within the cavity with a first terminal contacting the conductor a quarter wave length electrical distance from the second end of the conductor, a second tube terminal of said tube being connected to electrical ground; the improvement wherein the electrical filter means comprises: passive electrical components combined in a filter circuit; a two-terminal semiconductor device connected between the passive components and electrical ground; and bias circuit means connected to the non-grounded terminal of the semiconductor device, including a coupling loop mounted within the cavity in juxtaposition with the first end of the conductor and a rectifying means disposed between the coupling loop and the semiconductor device; whereby high powered electrical signals propagating along the conductor are coupled to the bias circuit, and therein rectified and utilized to forward bias the semiconductor device therewith detuning the electrical filter means and blocking passage of the high powered electrical signals.

4. In combination with a device for limiting the power of high frequency radio frequency signals, such device being of the type comprising: an electrically conducting sheath; a dielectric mounting supported within the sheath; an elongated conductor mounted within the sheath by means of the dielectric mounting, said conductor having a first end and at a spaced electrical distance therefrom a second end; and a gaseous electron discharge tube mounted within the sheath having a first terminal making electrical contact with the conductor at a spaced electrical distance from the second end thereof, a second tube terminal being connected to electrical ground; the improvement which comprises: a two-terminal semiconductor diode mounted within the sheath electrically connected between the conductor at a spaced distance from the second tube terminal and electrical ground; and a bias circuit, including a coupling loop mounted within the sheath adjacent to the elongated conductor and a rectifying means electrically connected between the coupling loop and the first terminal of the semiconductor diode; whereby electrical signals propagating along the conductor are limited in voltage when the gaseous discharge tube fires and are further limited in voltage when the forward biased semiconductor device conducts to electrical ground to cause detuning of the conductor and thereby block passage of the high powered electrical signals.

5. In combination with a device for limiting the power of high frequency electrical signal pulses, such device being of the type comprising: a resonant cavity; a conductor having a first end and at a spaced electrical distance a second end, the conductor being mounted within the cavity such that electrical signals of only limited pass band frequencies are propagated along the conductor through standing waves; gaseous electron discharge tube mounted within the cavity with a first terminal connected to the conductor at a point of maximum standing wave to voltage, a second tube terminal being connected to electrical ground; the improvement which comprises: a two-terminal semiconductor diode connected between the conductor at a point of another standing wave voltage peak and electrical ground; and bias circuit means mounted to derive an electrical signal from the conductor, being connected to the non-grounded terminal of the semiconductor; whereby the semiconductor diode is forward biased into conduction in the presence of strong electrical signal pulses on the conductor to block passage of said strong signals and simultaneously detune said conductor and remains capacitive in the presence of weak electrical signals on the conductor.

6. In combination with a device for limiting the power of incident radio frequency signals, such device being of the type comprising: an elongated conductor, electrical wave filter means electrically connected to the conductor; and a gaseous electron discharge tube having a first terminal connected to the conductor at a spaced electrical distance along the conductor from the conductor connection with the filter, a second tube terminal being connected to electrical ground; the improvement wherein the filter means includes passive means and a two-terminal semiconductor device electrically connected to the conductor and to the passive means, the semiconductor device being capacitive below a specified incident voltage and being conductive to electrical ground above the specified incident voltage; the improvement further comprising a bias circuit including coupling means mounted in juxtaposition to the conductor and a rectifying means connected in series with the coupling means, the bias circuit being connected to the semiconductor means and thereby forward biasing the semiconductor means in the presence of strong incident radio frequency signals to detune the filter, and thereby block said strong signals.

References Cited

UNITED STATES PATENTS

| | | | |
|---|---|---|---|
| 2,851,592 | 9/1958 | Webster | 325—318 |
| 3,063,011 | 11/1962 | Sproul et al. | 325—449 |
| 3,249,899 | 5/1966 | Broderick | 333—13 |

HERMAN KARL SAALBACH, *Primary Examiner.*

ELI LIEBERMAN, *Examiner.*

R. F. HUNT, S. CHATMON, Jr., *Assistant Examiners.*